United States Patent
Matsui et al.

(10) Patent No.: US 7,902,535 B2
(45) Date of Patent: *Mar. 8, 2011

(54) FUNCTIONAL MOLECULAR ELEMENT

(75) Inventors: Eriko Matsui, Tokyo (JP); Haruo Watanabe, Kanagawa (JP); Oliver Harnack, Stuttgart (DE); Nobuyuki Matsuzawa, Plochingen (DE); Akio Yasuda, Esslingen (DE); Tadashi Mizutani, Osaka (JP); Takae Yamauchi, Kyoto (JP); Susumu Kitagawa, Osaka (JP)

(73) Assignees: Sony Corporation, Tokyo (JP); Sony Deutschland G.m.b.H., Cologne (DE)

( * ) Notice: Subject to any disclaimer, the term of this patent is extended or adjusted under 35 U.S.C. 154(b) by 242 days.

This patent is subject to a terminal disclaimer.

(21) Appl. No.: 10/597,845

(22) PCT Filed: Feb. 2, 2005

(86) PCT No.: PCT/JP2005/002084
§ 371 (c)(1),
(2), (4) Date: Oct. 16, 2008

(87) PCT Pub. No.: WO2005/076379
PCT Pub. Date: Aug. 18, 2005

(65) Prior Publication Data
US 2009/0224223 A1  Sep. 10, 2009

(51) Int. Cl.
*H01L 47/00* (2006.01)
(52) U.S. Cl. .......... 257/2; 257/40; 257/E45.002
(58) Field of Classification Search .......... 257/2, 40, 257/E45.002
See application file for complete search history.

(56) References Cited

U.S. PATENT DOCUMENTS

| | | | |
|---|---|---|---|
| 4,964,700 A * | 10/1990 | Takabayashi | 349/200 |
| 6,128,214 A | 10/2000 | Kuekes et al. | |
| 6,130,739 A | 10/2000 | Shimoshikiryo | |
| 6,256,767 B1 | 7/2001 | Kuekes et al. | |
| 7,518,783 B2 * | 4/2009 | Matsui et al. | 359/321 |
| 2002/0075420 A1 | 6/2002 | Zhang et al. | |
| 2003/0010973 A1 | 1/2003 | Lorin et al. | |
| 2003/0012484 A1 | 1/2003 | Zhang et al. | |
| 2003/0226996 A1 | 12/2003 | Aramaki et al. | |
| 2004/0013345 A1 | 1/2004 | Zhang et al. | |

(Continued)

FOREIGN PATENT DOCUMENTS

JP       06-302805       10/1994

(Continued)

OTHER PUBLICATIONS

European Search Report issued on Mar. 17, 2010, for corresponding EP 05 71 0136.

(Continued)

*Primary Examiner* — Tu-Tu V Ho
(74) *Attorney, Agent, or Firm* — K&L Gates LLP (57) ABSTRACT

A functional molecular element is provided. The functional molecular element is adapted to change, by application of electric field, conformation of a disc shape like organic metallic complex molecule (1) which forms a columnar arrangement structure to exhibit function, wherein the structure of the organic metallic complex molecule is changed by application of electric field so that anisotropy of dielectric constant is changed. Accordingly, conductivity between measurement electrodes can be switched. As its stable value, there are three kinds of stable values or more. Thus, elements or devices to which such multi-value memory characteristic is applied can be constituted.

6 Claims, 9 Drawing Sheets

U.S. PATENT DOCUMENTS

2004/0201018 A1    10/2004    Yamahara

FOREIGN PATENT DOCUMENTS

| JP | 10-161145 | 6/1998 |
| JP | 2001-316354 | 11/2001 |
| JP | 2004221553 A * | 8/2004 |
| WO | 03-023876 | 3/2003 |
| WO | 2004-059756 | 7/2004 |

OTHER PUBLICATIONS

Feringa, Ben L., "Molecular Switches," Wiley-VCH, Weinheim, 2001.

Trzaska et al., "Cooperative Chirality in Columnar Liquid Crystals: Studies of Fluxional Octahedral Metallomesogens," J. Am. Chem. Soc. 1999, 121, 4518-4519.

Chen et al., "Large On-Off Ratios and Negative Differential Resistance in a Molecular Electronic Device," Science, 1999, vol. 286, 1551-1552.

Chen et al., "Conductance of a molecular junction", Science, 1997, vol. 278, 252-2.

Conductance of a Molecular Junction, M. A. Reed, C. Zhou, C. J. Muller, T. P. Burgin, and J. M. Tour, Science Oct. 10, 1997: pp. 252-254.

Biladienones from the Photooxidation of a meso-gem-Disubstituted Phlorin: Crystal and Molecular Structures of the 3N + O Coordinated Nickel(II) and Copper(II) Complexes, Christophe Jeandon, Bé né dicte Krattlinger, Romain Ruppert, and Henry J. Callot, American Chemical Society Inorg. Chem. 2001: 40, pp. 3149-3153.

Manganese(III) Biliverdln IX Dimethyl Ester: A Powerful Catalytic Scavenger of Suporoxide Employing the Mn(III)/Mn (IV) Redox Couple, Ivan Spasojevic, Ines Batlnlć-Haberle, Robert D. Stevens, Peter Hambright, Arthur N. Thorpo, Jan Grodkowski, Pedatsur Neta, and Irwin Fridovich, American Chemical Society, Inorg. Chem. 2001: 40, pp. 726-739.

Interconversion between Point Chirality and Hellcal Chirality Driven by Shape-Sensitive Interaction, Tadashi Mizutani, Shigeyuki Yagi, Atsushi Honmaru, and Hisanobu Ogoshi, J. Am. Chem. Soc. 1669: 118, pp. 5318-5319.

Helical Chirality induction by Point Chirality at Helix Terminal, Tadashi Mizutani, Shigeyuki Yagi, Tomoko Morinaga, Tetsutaro Nomura, Toru Takagishi, Susumu Kitagawa, and Hisanobu Ogoshi, J. Am. Chem. Soc. 2000: 121, pp. 754-759.

Allosteric Chirality Amplification In Zinc Blllnone Dlmer, Tadashi Mizutani, Noriaki Sakal, Shigeyuki Yagi, Toru Takagishi, Susumu Kitagawa, and Hisanobu Ogoshi, J. Am. Chem. Soc. 2000: 122, pp. 748-749.

Japanese Office Action for corresponding JP 2004-033055 issued on Sep. 7, 2010.

\* cited by examiner

R: SUBSTITUENT, e.g., C10H21

FUNCTIONAL MOLECULAR ELEMENT

CROSS REFERENCE TO RELATED APPLICATIONS

The present application claims priority to Japanese Patent Document No. P2004-033055 filed on Feb. 10, 2004, the disclosure of which is herein incorporated by reference.

The present invention relates to a novel functional molecular element which exhibits function under action (application) of electric field.

This Application claims priority of Japanese Patent Application No. 2004-033055, field on Feb. 10, 2004, the entirety of which is incorporated by reference herein.

In general, nano-technology is recognized as technology for observing, preparing (manufacturing) and utilizing fine structure having size of the order of one hundred millionth ($10^{-8}$ m=10 nm).

In the latter half of the year of 1980, ultra-high precision microscopes called scanning type tunnel microscopes have been invented so that one atom and/or one molecule can be observed. If such scanning type tunnel microscopes are used, not only atoms or molecules can be observed, but also atoms or molecules can be operated (manipulated) one by one.

For example, the example where atoms are arranged on the surface of crystal to write characters, and the like have been reported. However, even if it can be said that atoms or molecules can be operated or manipulated, it is not practical to operate or manipulate, one by one, a huge number of atoms or molecules to assemble new materials (substances) or devices.

In order to operate or manipulate atoms or molecules, or cluster thereof to form a structure of the nanometer size, a new ultra precision processing technology to realize such a structure is required. As such a fine processing technology of the nanometer precision, two systems are known when roughly classified.

One system is a method conventionally used in manufacturing processes for various semiconductor devices. This method is, e.g., such a method of the so-called top-down type to precisely shave a large silicon wafer down to the minimum size to prepare integrated circuits. The other system is a method of the bottom-up type to assemble atoms or molecules as small parts or components serving as micro (very small) unit to manufacture a target nano-structure.

In connection with the limit as to what structure of small size can be manufactured by the top-down system, there is the famous Moore's Law that Gordon Moore who is co-creator of Intel Corporation has presented in 1965. This rule is the content that "the degree of integration of transistor becomes double in eighteen months". Since 1965 (year), the semiconductor business world has enhanced degree of integration of transistor in accordance with the Moore's Law over thirty years.

International Technology Roadmap for Semiconductor (ITRS) for fifteen years in future announced from the U.S. Semiconductor Industrial Associates (SIA) indicates the opinion that the Moore's Law is continuously valid.

The ITRS consists of short-range roadmap until 2005 (year) and long-range roadmap until 2014 (year). In accordance with the short-range roadmap, process rule of the semiconductor chip is assumed to become equal to the order of 100 nm and the gate length of the microprocessor is assumed to become equal to 65 nm in 2005. In accordance with the long-range roadmap, the gate length is assumed to becomes equal to 20~22 nm in 2014.

As miniaturization of the semiconductor chip is advanced, operating speed becomes high and power consumption is suppressed at the same time. Further, the number of products (chips) taken from a single wafer is increased and the production cost is also lowered. This is because makers for microprocessors compete the process rule and the degree of transistor integration of new products.

On November in 1999, the research group of USA indicated epoch-making research result of miniaturization technology. The research result is directed to a method of designing gate of FET (Field Effect Transistor) called FinFET, which has been developed by the group including Professor Chainmin Fuh, et al. who is in charge of Computer Science at Barkley School of California University. This method enables formation of transistors which are 400 times greater than that in the prior art on a semiconductor chip.

The gate is an electrode for controlling flow of electrons at the channel of FET, and is caused to be of structure, according to present typical design, in which the gate is placed in parallel to the surface of the semiconductor and serves to control the channel from one side. In this structure, it was considered that since if the gate has not a predetermined length or more, it is impossible to cut off (interrupt) flow of electrons, gate length therefore constitutes one cause (factor) to limit miniaturization of transistor.

On the contrary, in the case of the FinFET, the gate is caused to be of fork type bridging over both sides of the channel to effectively control the channel. In the structure of the FinFET, the gate length and the transistor can be further reduced as compared to the conventional structure.

The gate length of the FET of the prototype that the same research group as above has manufactured is 18 nm, which is one tenth of present typical gate length. This gate length is equivalent to the size in 2014 (year), which is indicated by the long-range roadmap of ITRS. Further, it is said that gate length which is one half thereof may be realized. Since Fuh, et al. do not have intention to acquire the patent in anticipation that such structure will be widely employed in the semiconductor business world, there is also the possibility that the FinFET may also become main current of the manufacturing technology.

However, it is also pointed out that "Moore's Law" might reach the limit based on the natural law after all.

For example, in the semiconductor technology which is main current at present, circuit patterns are baked on silicon wafer by the lithography technology to manufacture semiconductor chip. In order to realize further miniaturization (fine structure), resolution must be increased. In order to increase resolution, a technology utilizing light having shorter wavelength must be put into practice.

Moreover, calorific value per semiconductor chip may become too large with increase of the degree of integration. As a result, the semiconductor chip caused to have high temperature may be erroneously operated, or thermally broken.

Further, in accordance with prediction by the specialist, it is also considered that when the semiconductor business world continues to miniaturize (reduce) chip as it is, the facility cost and/or the process cost are increased so that manufacturing of semiconductor chip might become impossible from an economical point of view in about 2015 also since deterioration of yield is invited in addition to the above.

As a new technology for overcoming technical obstacle of the top-down system as described above, the spotlight of attention is focused on research for allowing individual molecules to have functions as electronic parts (components). Devices based on such research or study are electronic device consisting of single molecule (molecular switch, etc.), and are manufactured (fabricated) by the bottom-up system.

Also with respect to metal, ceramics and/or semiconductor, researches (studies) for preparing (manufacturing) structure of nano-meter size by the bottom-top system are being performed. However, if attention is drawn to molecules which are primarily and individually independent and have variety to the number of about several million kinds in difference of shape and/or difference of function, etc. to exhibit the properties thereof, it is possible to design, by the bottom-up system, devices (molecular devices) having features entirely different from conventional devices to manufacture such devices.

For example, width of conductive molecule is only 0.5 nm. Wire of this molecule enables realization of wiring having density which is several thousands times than that of line width of about 100 nm which is realized by the present integrated circuit technology. Moreover, when, e.g. one molecule is used as memory element (device), recording which is ten thousands times or more than that of DVD (Digital Versatile Disc) can be made.

Molecular devices are synthesized by chemical process differently from the conventional semiconductor silicon. In 1986, Yuji Hizuka of Mitsubishi Denki Kabushiki Kaisha has developed the first organic transistor consisting of polythiophene (polymer) in the world.

Further, search group of U.S. Hewlett-Packard (HP) Corporation and Los Angeles school of California University succeeded manufacturing of organic electronic device and announced the content thereof in Science Magazine on July in 1999. Such organic devices are disclosed in U.S. Pat. No. 6,256,767 specification and U.S. Pat. No. 6,128,214 specification. They made (fabricated) switches by using molecular films consisting of several millions of rotaxane as organic molecule to connect these molecular switches to make AND gate serving as a basic logical circuit.

In addition, cooperative search group of the Rice University and the Yale University in U.S.A. succeeded to make molecular switch in which molecular structure is changed by electron injection under application of electric field to perform switching operation and announced such molecular switch in the Science Magazine on November in 1999 (J. Chen, M. A. Reed, A. M. Rawlett and J. M. Tour, "Large on-off ratios and negative differential resistance in a molecular electronic device", Science, 1999, Vol. 286, 1551-1552, J. Chen, M. A. Reed, C. Zhou, C. J. Muller, T. P. Burgin and J. M. Tour, "Conductance of a molecular junction", Science, 1997, Vol. 278, 252-2). The function to repeatedly perform on-off operation is a function which was not realized by the group of HP (Hewlett-Packard) Corporation and Los Angeles school of California University. The size thereof is one millionth of ordinary transistor, and constitutes basis for manufacturing small and high performance computer.

Professor J. Tour (Rice University, Chemistry) who succeeded synthesis stated that since high cost clean room used for ordinary semiconductor manufacturing process is unnecessary, production cost of molecular switch can be reduced down to one several thousandth of prior art. Within five to ten years, he has a schedule to make hybrid type computer of molecule and silicon.

In 1999, Bell Laboratory (Lucent Technology Corporation) fabricated organic thin film transistor by using pentacene single crystal. This organic thin film transistor exhibited the characteristic equivalent to inorganic semiconductor.

Although it is said that studies or researches of molecular device having a function as electronic component are extensively being performed, most of studies relating to molecular devices until now were directed to studies in which drive is performed by light, heat, proton or ion, etc. (Ben L. Feringa, "Molecular Switches", WILEY-VCH, Weinheim, 2001).

As conventional molecular element driven by electric field, there only existed element utilizing change of material property of molecule itself which has been caused to undergo action (application) of electric field, i.e., element in which electronic state of molecule itself considered to be single element is changed by electric field. For example, in organic FET, carrier transfer (movement) in organic molecule is modulated by change of electric field exerted on organic molecule within the channel area.

In view of actual circumstances as described above, an object of the present invention is to provide a functional molecular element (device) effectively controlled by electric field on the basis of a new principle.

SUMMARY

The present invention is directed to a functional molecular element in which anisotropy of dielectric constant is changed by molecular structure change induced by electric field.

In the present invention, since functional molecular element is constituted by using the system in which anisotropy of dielectric constant is changed by molecular structure change induced by electric field, the electric characteristic as a functional molecular element, e.g., conductivity, etc. can be obtained, and its electric characteristic is modulated by change of molecular structure induced by change of the electric field.

Such mechanism of action of electric field is directed to a mechanism adapted to directly control, by electric field, dielectric constant of the functional molecular element to modulate its function, and is not found out in conventional functional molecular element or device, e.g., Field Effect Transistor, etc. On the basis of new electric field action mechanism, it is possible to constitute functional molecular element which can control electric characteristic with high response of electric field.

Still further objects of the present invention and merits obtained by the present invention will become more apparent from embodiments which will be explained below with reference to the attached drawings Additional features and advantages of the present invention are described in, and will be apparent from, the following Detailed Description and the Figures.

BRIEF DESCRIPTION OF THE FIGURES

FIGS. 1A to 1C are schematic diagrams illustrating three switching operation modes that functional molecular element according to the present invention indicates, wherein FIG. 1A shows the initial state where no electric field is applied, FIG. 1B shows the state where low electric field (voltage) is applied, and FIG. 1C shows the state where high electric filed (voltage) is applied.

DETAILED DESCRIPTION

As functional molecular element according to the present invention, it is preferable to use organic metallic complex molecule of desirably disc-shaped, or disc-shape like organic molecule having, e.g., side chains in normal (straight) chain form having anisotropy of dielectric constant and adapted so that structure is changed under action (application) of electric field, and metallic ion. The fact that the organic molecule has dipole moment also results in action equivalent to anisotropy of dielectric constant.

If organic molecule in a form similar to disc shape having such side chains is used, the property of discotic liquid crystal is indicated so that orientation of molecules takes place. Thus, anisotropy of high dielectric constant can be exhibited. With respect to this, there can be referred, 'S. T. Trzaska, H-F. Hsu and T. M. Swager, "Cooperative Chiralith in Columnar Liquid Crystals Studies of Fluxional Octahedral Metallomesogens.", J. Am. Chem. Soc., 1999, Vol. 121, 4518-4519, and Yo Shimizu "Columnar Liquid Crystals: Versatile molecular structures thereof and Intermolecular interaction", Liquid Crystals, 2002, Vol. 6, 147-159 which will be described later'.

On the other hand, since the organic molecule has anisotropy of dielectric constant and the structure or orientation thereof is changed under application of electric field so that conformation of portion where complex is formed, etc. is changed in correspondence with change of the electric field. Thus, anisotropy of dielectric constant, i.e., electric characteristic is changed.

Further, it is preferable that liquid crystal solution of disc-shape like organic metallic complex molecules having side chains is disposed between at least opposite electrodes in the state where orientation thereof is performed on the electrode for applying electric field so that an output corresponding to the electric field is taken out from at least one electrode of the opposite electrodes.

Further, it is preferable that there is formed columnar arrangement structure in which disc-shape like organic metallic complex molecules having side chains are arranged in columnar form between these pair of opposite electrodes.

Moreover, it is preferable that the structure of the organic metallic complex molecule is changed by change of an electric field exerted on disc-shape like organic metallic complex molecule having side chains so that an angle that the major axis direction of the dielectric constant tensor and the formation plane surface of the pair of opposite electrodes form is changed.

In this case, it is preferable that an insulating layer is provided on a first electrode for applying electric field, second and third electrodes are formed, as the opposite electrodes, on the insulating layer in such a manner that they are not in contact with each other, a columnar arrangement structure is disposed between at least these second and third electrodes, and a fourth electrode for applying the electric field is provided directly or through insulating layer on disc shape like organic metallic complex molecule having side chains which forms the columnar arrangement structure.

Moreover, it is preferable that disc-shape like organic molecule having side chains is biladienone derivative such as biliverdin or biladienone, etc., and metallic ion is zinc ion, copper ion or nickel ion, etc.

In addition to the biladienone derivative, there may be used bilin derivative, florine derivative or chlorine derivative, etc. As the above-mentioned metal, there may be used other typical element and/or transition metal.

Further, the side chain may have normal (straight) shape having the number of carbon atoms of 3 to 12. For example, —$C_{10}H_{21}$ or —$C_8H_{17}$ may be mentioned. By side chain having such number of carbon atoms, orientation of organic molecules can be satisfactorily performed without crystallization. Synthesis also becomes easy. Namely, when the number of carbon atoms is 1~2, organic molecule becomes easy to be crystallized so that material property like liquid crystal is not exhibited. As a result, unsatisfactory orientation takes place. Moreover, when the number of carbon atoms becomes equal to 13 or more, organic molecule is difficult to rather undergo orientation. Synthesis also becomes difficult.

Further, as solvent used in solution, there may be used, e.g., polar solvent, e.g., biphenyl-system liquid crystal such as 4-pentyl-4'-cyanobiphenyl (5CB) or tetrahydrofuran, etc. It is preferable that concentration of organic molecule such as biladienone metallic complex, etc. in this liquid crystal solution is 0.1~80 weight %. Further, it is desirable that such concentration is 10~30 weight %.

It is to be noted that the above-described "functional molecular element" is not limited to element constituted as element, but may also include molecular device as previously described in which such element is assembled (This similarly applies to hereinafter).

Then, preferred embodiments of the present invention will be explained in concrete terms with reference to the attached drawings.

Embodiment 1

Functional Molecular Element

Figure 1A:
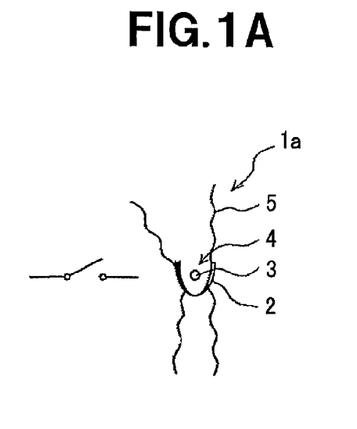
Figure 1B:
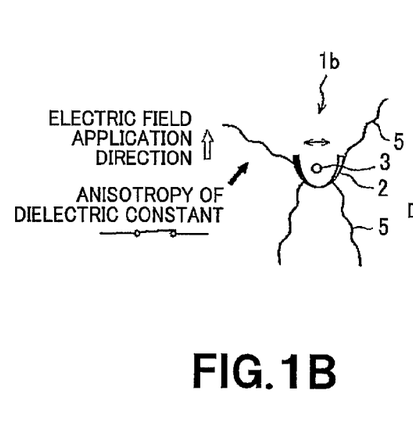
Figure 1C:
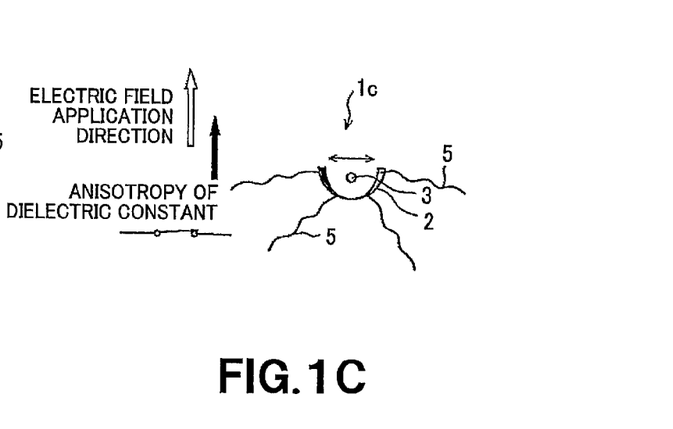

As an example of function of molecular element in which three-dimensional structure is changed by application of an electric field to exhibit function, switching operation is conceivable. FIGS. 1A to 1C schematically illustrate, in a model form, change taking place at the periphery of metallic ion 3 at the time of applying an electric field to the functional molecular element 1 by taking an example of the functional molecular element 1 in which metallic ion 3 and disc-shape like organic molecule 2 having side chains 5 form complex 4.

Since disc-shape like organic metallic complex molecule having side chains 5 (functional molecule 1) has plural activity portions with respect to metal 3, there exist plural structural isomers having production energies substantially equal to each other. In the initial state where no electric field (voltage) is applied as shown in FIG. 1A, the organic metallic complex molecule takes structure 1a having lowest production energy.

However, when, e.g., low electric field (voltage) is applied, the organic metallic complex molecule 1 performs structural change balanced with its production energy difference and applied electric field (voltage) strength in such a manner that there results structure 1b in which anisotropy of dielectric constant is along applied electric field direction (electric field application direction) in attempting to allow dielectric constant anisotropy to be in correspondence with applied electric field direction as shown in FIG. 1B.

Further, when, e.g., higher electric field (voltage) is applied, the organic metallic complex molecule performs structural change in such a manner that there results structure 1c in which its production energy is high and dielectric constant anisotropy is caused to be, to more degree, in correspondence with electric field application direction as shown in FIG. 1C.

As stated above, with respect to dynamics of the switching operation that the functional molecule exhibits at the time of application of electric field, at least two kinds of operation modes shown in FIGS. 1B, 1C are conceivable depending upon difference of electric field strength. This will be further explained in detail.

In the initial state where no voltage is applied as shown in FIG. 1A, disc-shape like organic metallic complex molecule 1a having side chains 5 of the functional molecular element 1 attempts to take circular structure which is closed as close as possible.

When electric field (voltage) is applied as shown in FIG. 1B in this state, the disc-shape like organic metallic complex molecule 1 having side chains 5 attempts to take, e.g., opened (expanded) circular structure 1b in such a manner that direction of dielectric constant anisotropy attempts to become in correspondence with direction of electric field. Moreover, when higher electric field (voltage) is applied as shown in FIG. 1C, the structure of the organic metallic complex molecule 1 changes into extended circular structure 1c in a manner to allow direction of dielectric constant anisotropy to be further in correspondence with electric field application direction while production energy is higher than that at the time when no electric field is applied.

When such state is viewed as the entirety of column, there is performed a change as if spiral pitch expands or contracts.

As described above, the structure or orientation of disc-shape like organic metallic complex molecule 1 having side chains is changed by application of electric field. This causes change in the structure of the complex formation part 4 with respect to metallic ion 3 to change dielectric constant, i.e., conductivity of the functional molecule 1.

As the functional molecule 1, several combinations are conceivable depending upon difference of the configuration, etc. of disc-shape like organic molecule 2 having side chains 5 or complex formation part 4, etc.

Figure 2:
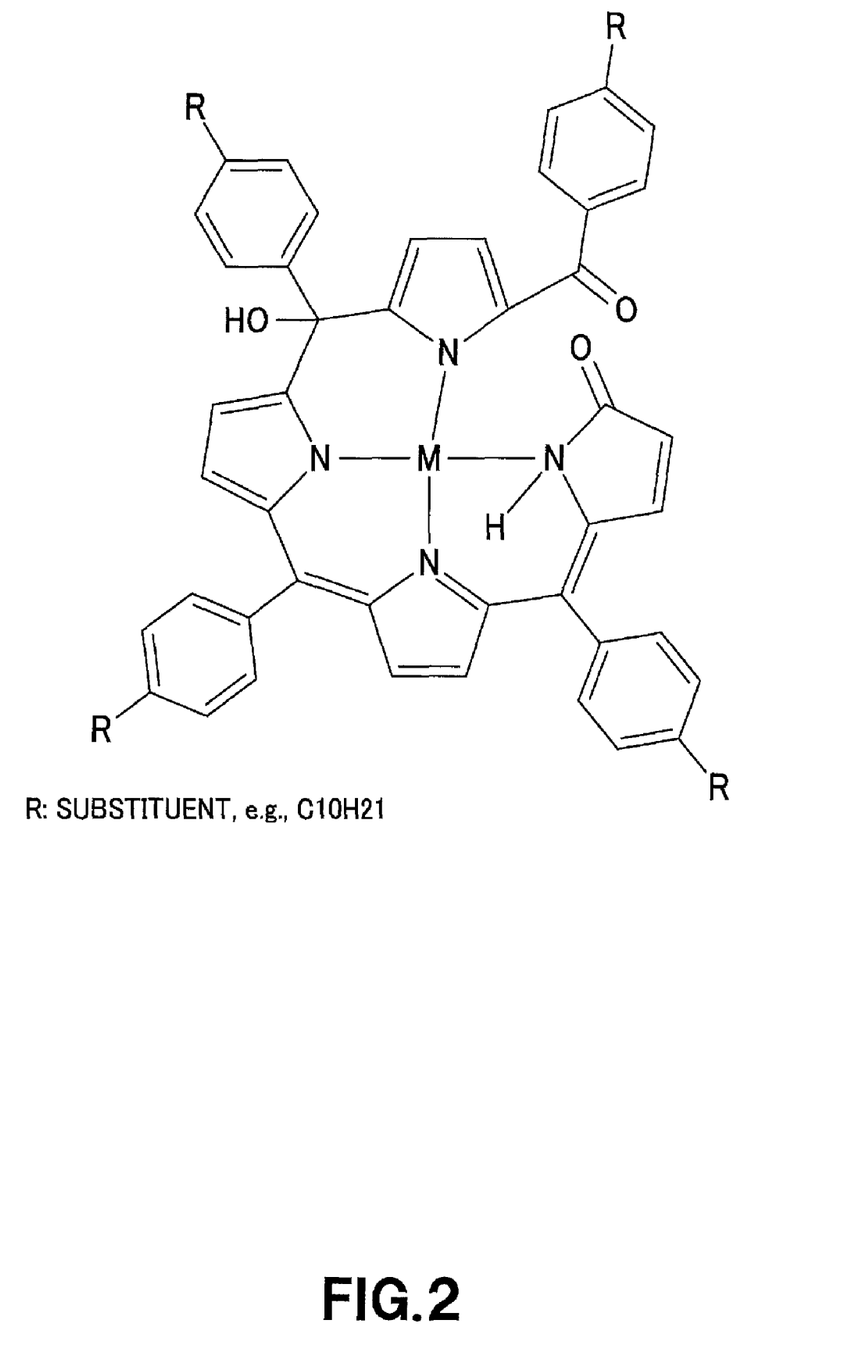
FIG. 2 is a view showing structural formula of biladienone metallic complex constituting functional molecular element.

For example, FIG. 2 shows organic metallic complex molecule 1 of disc-shape like organic molecule 2 having side chains 5 consisting of substituent (R) (e.g., $-C_{10}H_{21}$), e.g., biladienone derivative having C=O group facing to each other at the terminal end thereof and metallic ion (M), e.g., Zn (II) ion.

Figure 3:
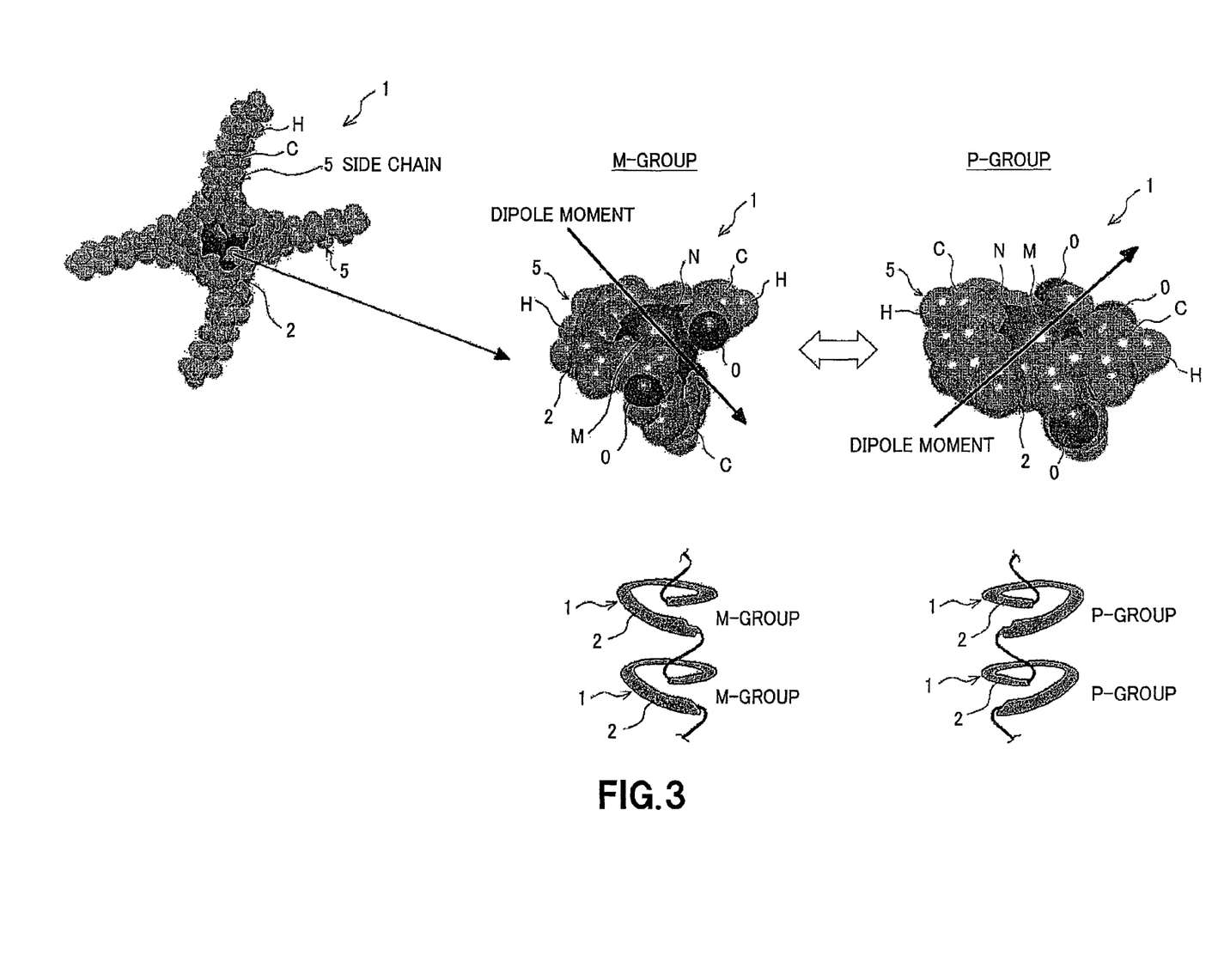
FIG. 3 is a model view showing model of chemical structure of biladienone metallic complex and spiral structure thereof.

In this organic metallic complex molecule 1, molecules take twisted structure by existence of C=O group (carbonyl group) of end terminals facing to each other, and plural molecules takes π-π stack structure therebetween to wind spiral. In FIG. 3, model of the molecular structure thereof is shown. In this case, the spiral structure is formed by optical isomer of M-group or P-group. Pitch between molecules of the spiral structure is changed by action (application) of the electric field.

This organic metallic complex 1, e.g., biladienone metallic complex takes blue in the ordinary state where no electric field (voltage) is applied, and causes change of green→thin brown by application of electric field. In addition, when electric field is cut OFF, the organic metallic complex 1 reversibly returns to the original state. It is to be noted that such change takes place also by temperature, and it is therefore considered that when both electric field and temperature are controlled, molecular structure may be similarly changed.

Embodiment 2

Field Effect Type Molecular Device

Figure 4A:
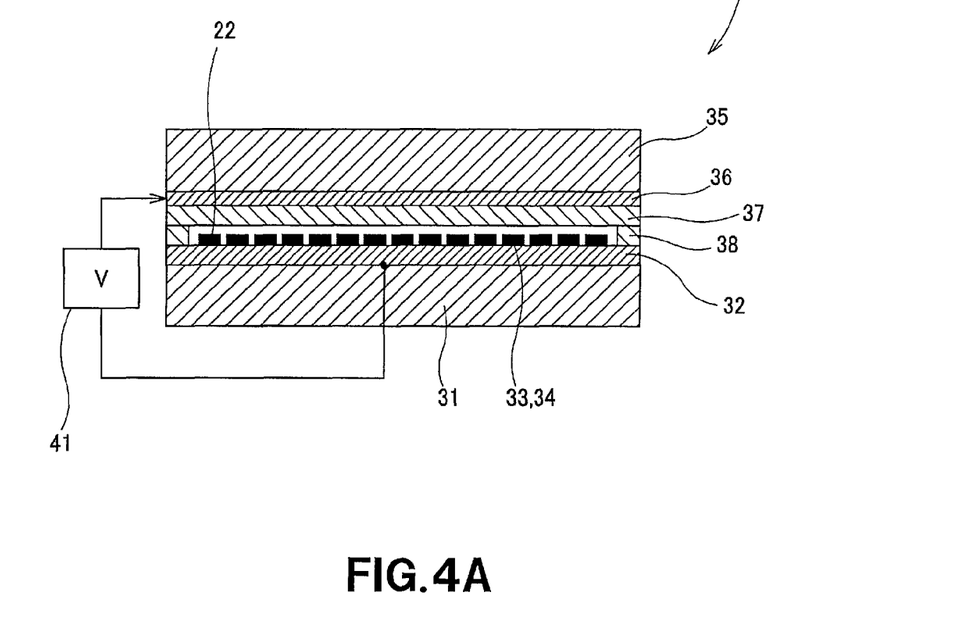
FIG. 4A shows a schematic cross sectional view of Field Effect type molecular device to which the present invention is applied.
Figure 4B:
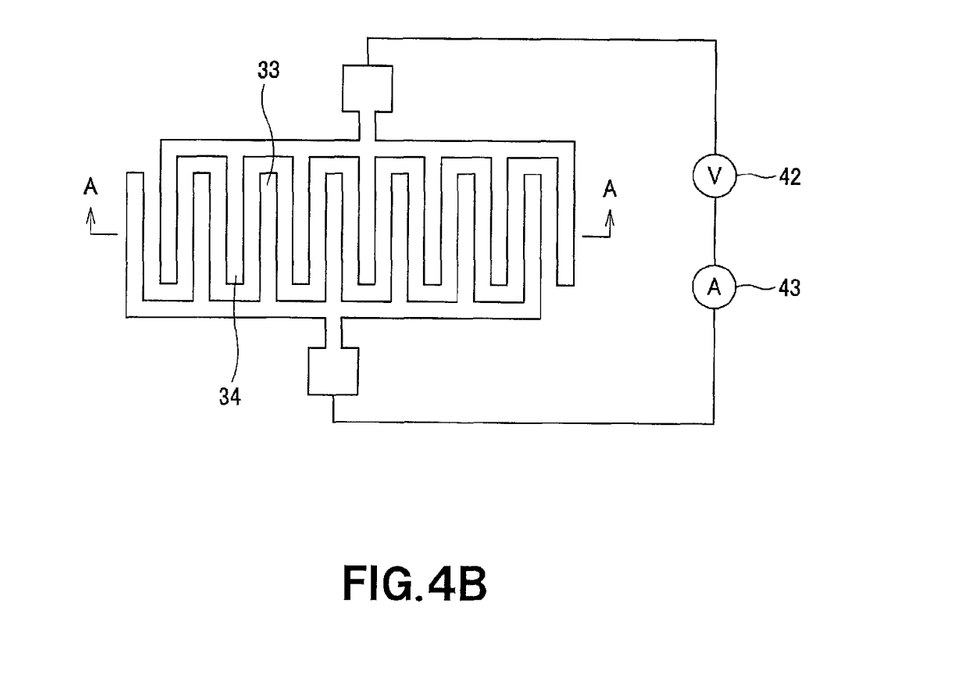
FIG. 4B is a plane view of comb-shaped electrode.

Here, as disc shape like organic metallic complex molecule 1 which forms columnar arrangement structure, there is used complex of biladienone 2 and zinc (II) ion as metallic ion 3, which is used in FIG. 2, and a Field Effect type molecular device 21 in which such complex is assembled as shown in FIGS. 4A and 4B and a manufacturing process thereof will be explained.

FIG. 4A is a schematic cross sectional view showing the structure of the Field Effect type molecular device 21, and FIG. 4B shows comb-shaped electrodes 33 and 34 used therein. FIG. 4A is a schematic cross sectional view in which the Field Effect type molecular device 21 is cut along A-A line shown in FIG. 4B.

In the Field Effect type molecular device 21, an insulating layer 32 is formed on a first base (substrate) 31 doubling as an electrode for applying control electric field, and comb-shaped electrodes 33 and 34 for measuring conductivity of the biladienone metallic complex 1 are formed thereon. On the other hand, an ITO (Indium Tin Oxide) film 36 serving as another electrode for applying control electric field is formed on a second base (substrate) 35, and a homogeneous orientation film (insulating film) is laminated thereon. A liquid crystal solution 22 of the organic metallic complex 1 consisting of biladienone and zinc (II) ion 3 is put along with spacer (of which illustration is omitted) between two bases 31 and 35, and the peripheral portion is sealed by a sealing material 38.

The first base 31 doubling as an electrode for applying control electric field and the ITO film 36 serving as another electrode for applying control electric field are electrically connected to a power source 41 for applying control electric field. In addition, the comb-shaped electrodes 33 and 34 are electrically connected to a voltage meter 42 and a current meter 43 which are adapted for measuring conductivity.

Figure 5:
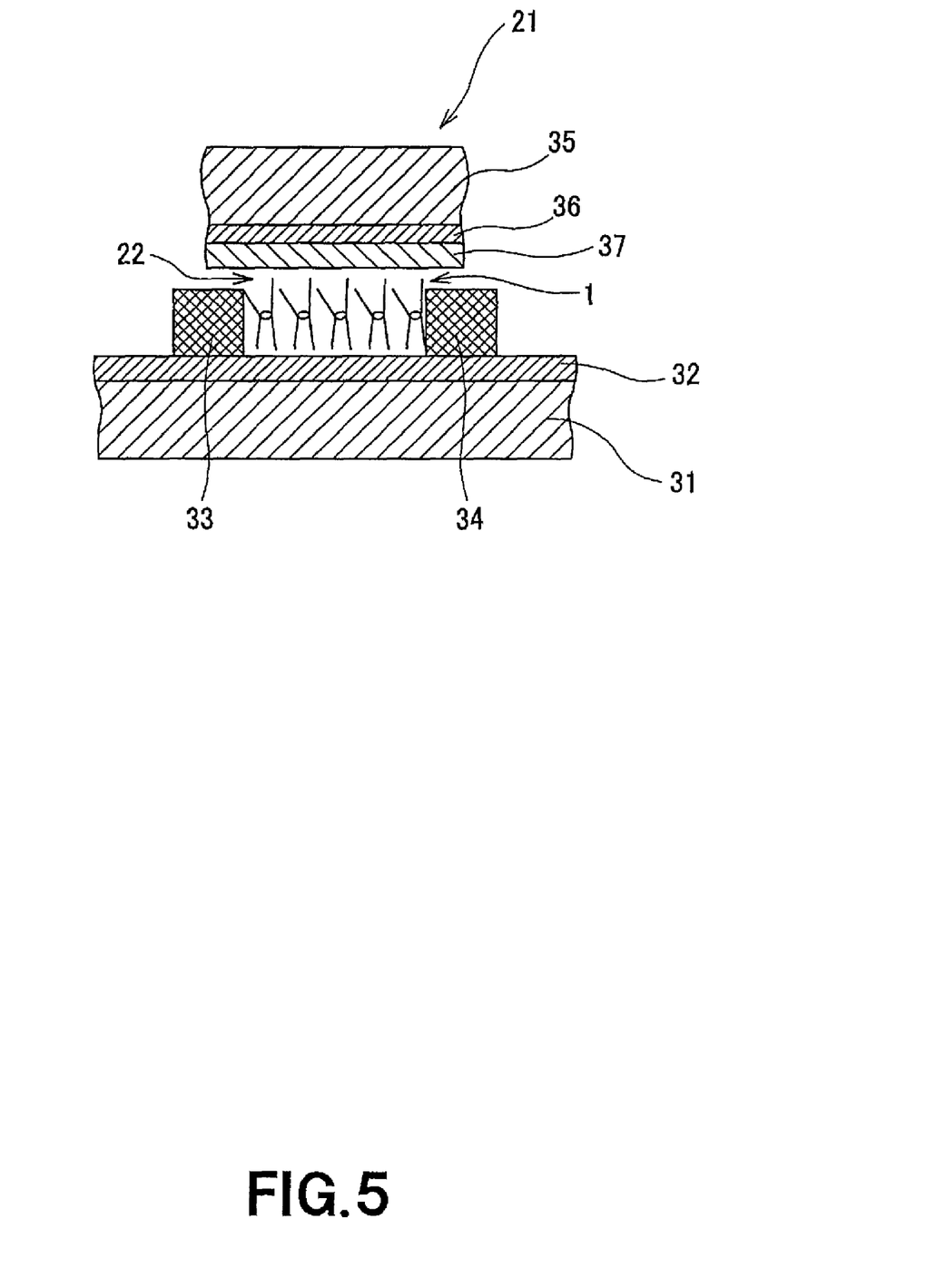
FIG. 5 is a schematic cross sectional view showing, in an enlarged manner, the essential part of the Field Effect type molecular device.

FIG. 5 is a conceptual schematic cross sectional view for explaining, on molecular level basis, the structure of the Field Effect type molecular device 21. Although only five units of complex molecules 1 of biladienone 2 and zinc (II) ion 3 are illustrated in FIG. 5, such an illustration is made as representative, and it is therefore a matter of course that a large number of the same molecules as above are included in practice (It is to be noted that illustration of liquid crystal molecules is omitted).

As shown in FIG. 5, in the state where electric field is turned OFF, orientation of complex molecules 1 is performed in upper and lower directions in the figure along the side surface of the comb-shaped electrodes, e.g., gold electrodes 33, 34 to form columnar arrangement structure 44 so that the above-described structural change takes place by application of electric field from this orientation state.

A manufacturing process for the Field Effect type molecular device 21 will be explained below by making reference to FIG. 5.

First, control electric field applying electrodes 31 and 36 for applying control electric field to biladienone metallic (zinc) complex, and comb-shaped electrodes 33 and 34 for measuring conductivity of biladienone are fabricated.

As the first base (substrate) 31 doubling as an electrode for applying control electric field, there is used, e.g., silicon substrate doped at high concentration. Silicon oxide film is formed by thermal oxidation on the surface of the first base 31 so that insulating layer 32 is provided. The comb-shaped electrodes 33 and 34 such as gold electrode, etc. are formed on the insulating layer 32 by sputtering or patterning.

On the other hand, as the second base 35, there is used, e.g., glass base. ITO (Indium Tin Oxide) film is formed on the surface thereof by vacuum deposition, etc. to allow the ITO film thus formed to be another electrode 36 for applying control electric field. Further, an insulating layer 37 such as polyvinyl alcohol, etc. is formed on the ITO film 36 by coating, etc. Such insulating layer 37 may be liquid crystal orientation film by rubbing, etc.

Then, material of the functional molecular element is assembled into the portion between the above-described electrodes 31 and 36 to prepare (manufacture) the main part of the Field Effect type molecular device 21 which can perform measurement of modulation of conductivity.

First, zinc complex 1 of the biladienone 2 is dissolved into 4-pentyl 4'-cyanobiphenyl (5CB) liquid crystal 40 having positive dielectric constant anisotropy to coat the liquid crystal solution 22 onto the insulating layer 32.

The first and second bases 31 and 35 are stuck so that the insulating film 37 formed on the second base 35 becomes closely into contact with the 4-pentyl-4'-cyanobiphenyl (5CB) liquid crystal solution 22 of the biladienone.

Finally, the peripheral portion of the two bases 31 and 35 which have been stuck is sealed by a sealing material 38 such as epoxy resin, etc. to complete the Field Effect type molecular device 21.

Figure 6A:
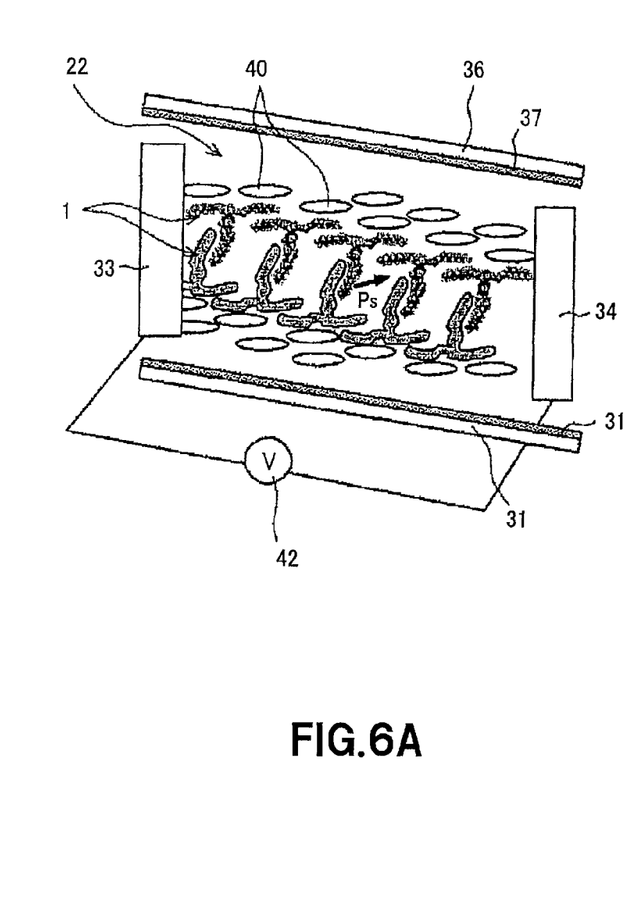
FIG. 6A is a schematic perspective view showing the behavior at the time when voltage of the Field Effect type molecular device is turned ON, and FIG. 6B is a schematic perspective view showing the behavior when voltage of the Field Effect type molecular device is turned OFF.
Figure 6B:
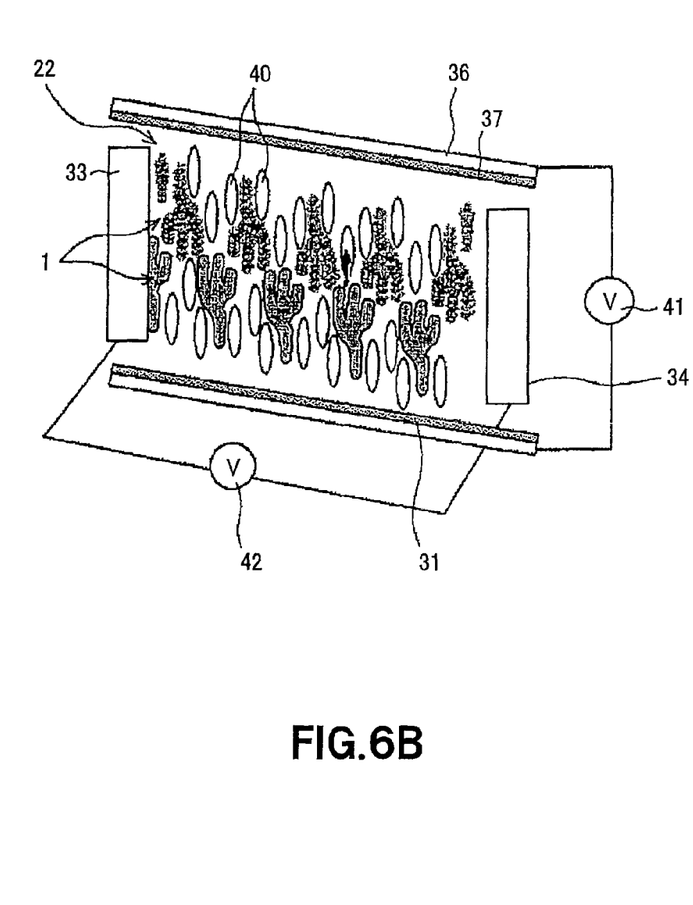

A voltage applied across the electrodes 31 and 36 for applying control electric field of the Field Effect type molecular device 21 thus fabricated is caused to be turned ON and OFF to perform conductivity measurement (corresponding to measurement of the transistor characteristic) of the biladienone metallic complex 2 between the comb-shaped electrodes 33 and 34. FIG. 6A shows, in a model form, the behavior (structural change) of molecules when electric field is in OFF state, and FIG. 6B shows, in a model form, the behavior (structural change) of molecules when electric field is in ON state.

Figure 7:
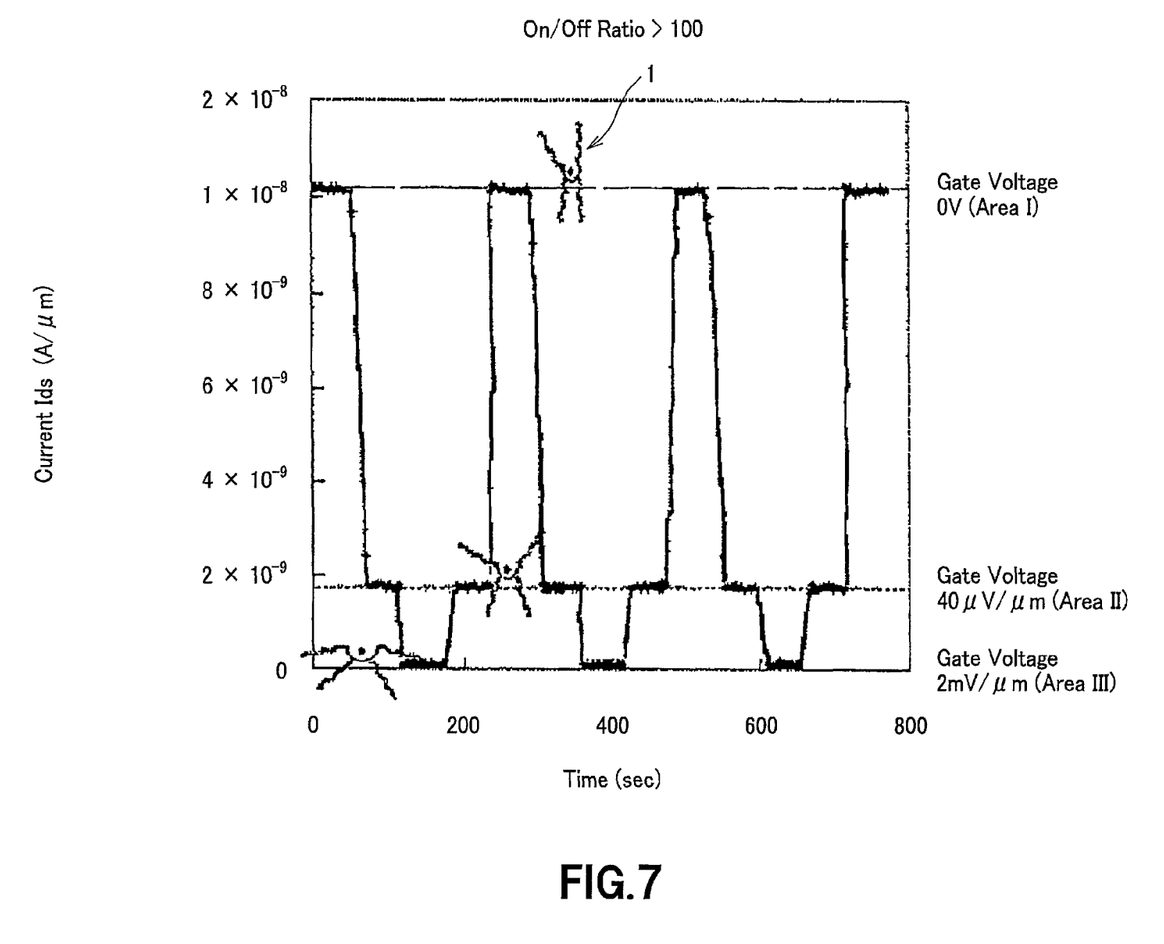
FIG. 7 is a graph showing, every ON/OFF time, the relationship between current and voltage of Field Effect type molecular device according to the practical example 1 of the present invention.

As a result, as shown in FIG. 7 which will be described later, for example, there is observed a modulating action such that low resistance value is indicated when electric field is in OFF state, but the resistance value is increased by one figure (digit) or more even when very low voltage is applied and the resistance value is increased when voltage is further increased. Namely, as the stable state of the structure, there exist at least three kinds of stable states, i.e., three stages having gate voltages of 0V, 40 µV/µm and 2 mV/µm thus to have ability to apply such multi-value memory characteristic. Particularly, it is extremely advantageous that the multi-value memory can be realized even at low voltage.

As stated above, the electric field strength for driving biladienone metallic complex is very small, and is a value lower by about two figures (digits) as compared to, e.g., electric field strength when 4-pentyl 4'-cyanobiphenyl liquid crystal performs switching operation. Accordingly, it is a matter of course that the above-mentioned resistance modulating action is not based on switching of 4-pentyl-4'-cyanobiphenyl liquid crystal molecule.

Moreover, when a voltage applied across the electrodes 31 and 36 for applying control electric field is caused to be placed in OFF state to change measurement voltage across the comb-shaped electrodes 33 and 34 to perform conductivity measurement (corresponding to measurement of the diode characteristic) of the biladienone metallic complex between the comb-shaped electrodes 33 and 34, a predetermined resistance value is indicated irrespective of measurement bias voltage value. Namely, any diode characteristic is not indicated.

As described above, there is nothing but to mean that the fact that the transistor characteristic in which conductivity is changed by application of control electric field (gate voltage) is indicated as described above, but the fact that diode characteristic is not indicated indicates that the biladienone metallic complex has very excellent orientation state and has high order parameter.

Since biladienone molecular group used has liquid crystal characteristic, but it is not necessary for switching itself to exhibit liquid crystal property (there is no possibility that liquid crystal property may not be exhibited by single molecule), it is a matter of course that the biladienone metallic complex can be utilized also as an element based on molecular level.

It is to be noted that molecular element according to this embodiment can be applied to various electronic device fields such as switch, transistor, memory, logic circuit and/or display, etc.

In accordance with the above-described present invention, it is possible to provide a novel functional molecular element adapted to perform, by application of electric field, structural change, with respect to electric field direction, disc shape like organic metallic complex molecule 1 which forms the columnar arrangement structure to modulate the structure of the complex molecule to resultantly control anisotropy of dielectric constant.

In other words, there is provided a system of realizing molecular element from an entirely new viewpoint differently from a system in which molecular itself is considered as n-type or p-type semiconductor in a manner resembling semiconductor of the silicon system as conventionally proposed to change electronic state of the molecule to thereby change conductivity.

From the above facts, the functional molecular element based on the present invention has, in addition to the merits in which elements having size ranging from normal size up to nano-size can be constituted by the same material molecule, and/or material molecule suitable for object can be selected from a very large kinds of material molecules, merits in connection with the following points.

1 Low Power Consumption

Since the operation is performed with one molecule or one electron being as unit, the functional molecular element is operated fundamentally at low power consumption. In the biladienone used above, there is very small power consumption of the order exceeding by one figure (digit) as compared to energy of room temperature. Since calorific quantity is small, the problem by heat is difficult to take place even if high integration is performed.

2 There is No Necessity to Select Drive Frequency

As seen from the improvement in high speed response characteristic of recent liquid crystal, material or structure is devised so that high speed response more than conventional inorganic semiconductor can be expected.

3 Low Environmental Pollution Characteristic

In synthesis of ordinary organic compounds, reagent, etc. harmful to human being or environment as used in the manufacturing process for inorganic semiconductor is hardly required.

Then, practical example of the present invention will be explained in more detail.

Practical Example 1

The Field Effect type molecular device 21 shown in FIG. 5 was prepared. First, there were formed control electric field applying electrodes 31 and 36 for applying control electric field to biladienone metallic complex 1 having M=Zn, R=—C10H21 shown in FIG. 2, and conductivity measurement electrodes 33 and 34 for measuring conductivity.

As the first base (substrate) (electrode for applying control electric field) 31, there was used silicon substrate doped at high concentration. Heat treatment was implemented onto the surface of the first base 31 to form silicon oxide thin film to allow the silicon oxide film thus formed to be insulating layer 32. The comb-shaped electrodes 33 and 34 consisting of gold were formed on the insulating layer 32 by sputtering or patterning as electrodes for measuring conductivity of the biladienone metallic complex 1.

Then, ITO transparent electrode 36 was formed on the second base (glass base) 35 by vacuum deposition as another electrode for applying control electric field thereafter to form insulating layer 37 on the ITO transparent electrode 36. As this material, polyvinyl alcohol was selected. 10 weight % aqueous solution of polyvinyl alcohol was prepared to coat the aqueous solution thus prepared onto the ITO 36 by the spin-coat process to perform heat treatment for 30 minutes at 110° C. thereafter to dry it for 72 hours in vacuum.

Further, the first and second bases 31 and 35 are stuck with each other through spacer so that gap between the both bases becomes equal to 5 µm.

Then, liquid crystal solution 22 consisting of zinc complex 110 weight % of biladienone 2 and 90 weight % of 4-pentyl-4'-cyanobiphenyl (5CB) 40 is injected into the portion between the first and second bases 31 and 35 by making use of the capillary phenomenon.

Finally, the peripheral portion of the two bases 31 and 35 which have been stuck was sealed by a sealing material 38 to complete the Field Effect type molecular device 21.

When a voltage applied across the control electric field applying electrodes 31 and 36 of the Field Effect type molecular device 21 fabricated in this way is caused to be turned ON and OFF to measure, by a.c. bias voltage, conductivity of the biladienone 2 between the comb-shaped electrodes 33 and 34, a large current quantity was indicated when electric field is in OFF state, but modulating action was observed such that current quantity is lowered at two stages by application of electric field.

FIG. 7 is a graph showing, with respect to the magnitude of applied voltage, the result obtained by applying d.c. electric field across the control electric field applying electrodes 31 and 36 of the Field Effect type molecular device 21 fabricated in this way to measure current value between the comb-shaped electrodes 33 and 34 in this instance.

In accordance with the graph, when viewed from applied voltage, the entirety is classified into three areas. In FIG. 7, illustration is made such that the structural diagrams of biladienone 2 between the electrodes 31 and 36 are added to respective areas in a model form. Namely, at the time of the area I where applied voltage is in OFF state, relatively high current value, i.e., low resistance characteristic was indicated. Within the area II where applied voltage is 40 µV/µm, the first structure change took place to indicate intermediate resistance value. Further, at the time of the area III where applied voltage is 2 mV/µm, the second structure change took place to indicate relatively low current value, i.e., high resistance characteristic. In this case, ON/OFF ratio>100 is obtained. This is very satisfactory.

Accordingly, there exist at least three kinds of stable states of the structure. Thus, such multi-value memory characteristic can be applied.

Figure 8:
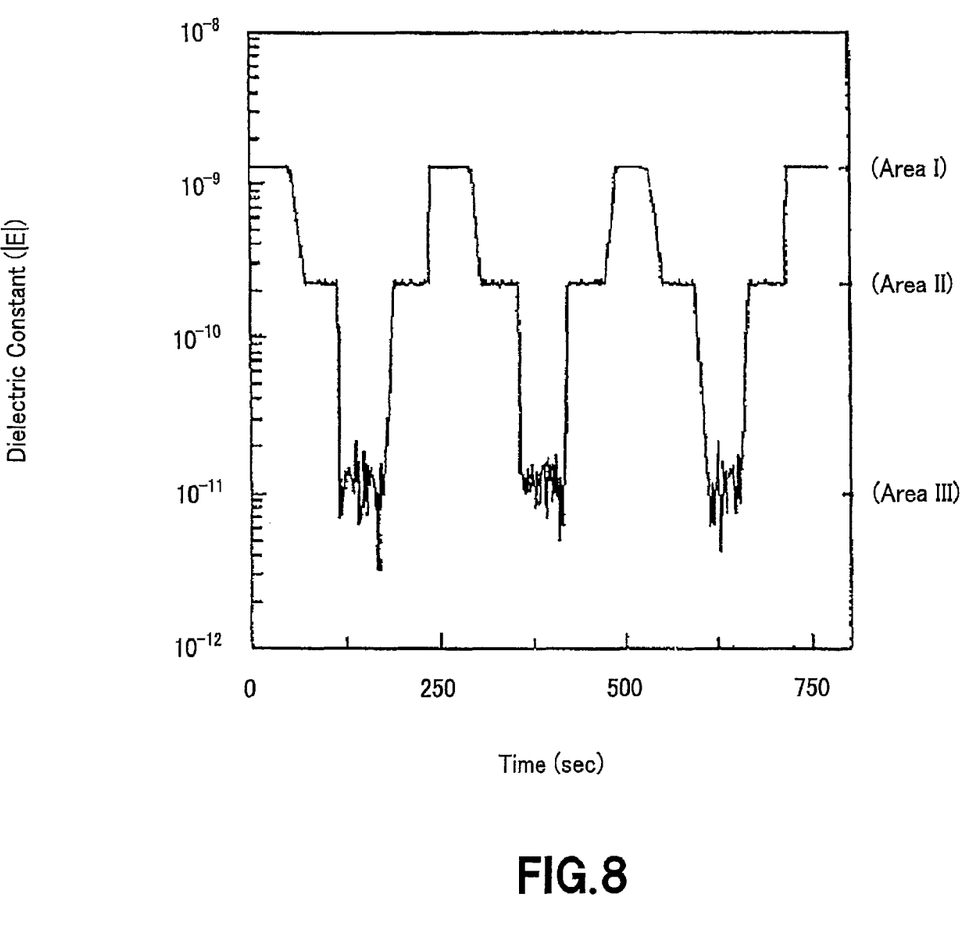
FIG. 8 is a graph showing the relationship between dielectric constant and voltage of the Field Effect type molecular device.

Moreover, measurement of dielectric constant between the comb-shaped electrodes 33 and 34 was performed simultaneously with the current quantity measurement. The result of FIG. 8 verifies the mechanism in which dielectric constant is changed followed by current quantity change and resistance change shown in FIG. 7 is induced by dielectric constant change.

As described above, since there is constituted functional molecular element adapted to change, by application of electric field, conformation of disc shape like organic metallic complex molecule 1 which forms the columnar arrangement structure to exhibit function, the structure of the organic metallic complex molecule 1 is changed when electric field is applied. Namely, anisotropy of the dielectric constant is changed. Accordingly, conductivity between measurement electrodes is permitted to be switched. As the stable value thereof, there are two or three kinds of stable states, and/or kinds more than three kinds. Thus, its multi-value memory characteristic can be applied.

Such electric field action mechanism was not found in conventional functional molecular elements or devices for directly controlling electronic state of the functional molecular element by electric field, e.g., Field Effect Transistor, etc. On the basis of such a new electric field action mechanism, it is possible to constitute a functional molecular element capable of controlling electric characteristic with good electric field response.

Comparative Example 1

A bias voltage applied across the comb-shaped electrodes 33 and 34 was increased or decreased without applying electric field across the control electric field applying electrodes 31 and 36 in order to observe the diode characteristic in the practical example 1 to measure current quantity.

Figure 9:
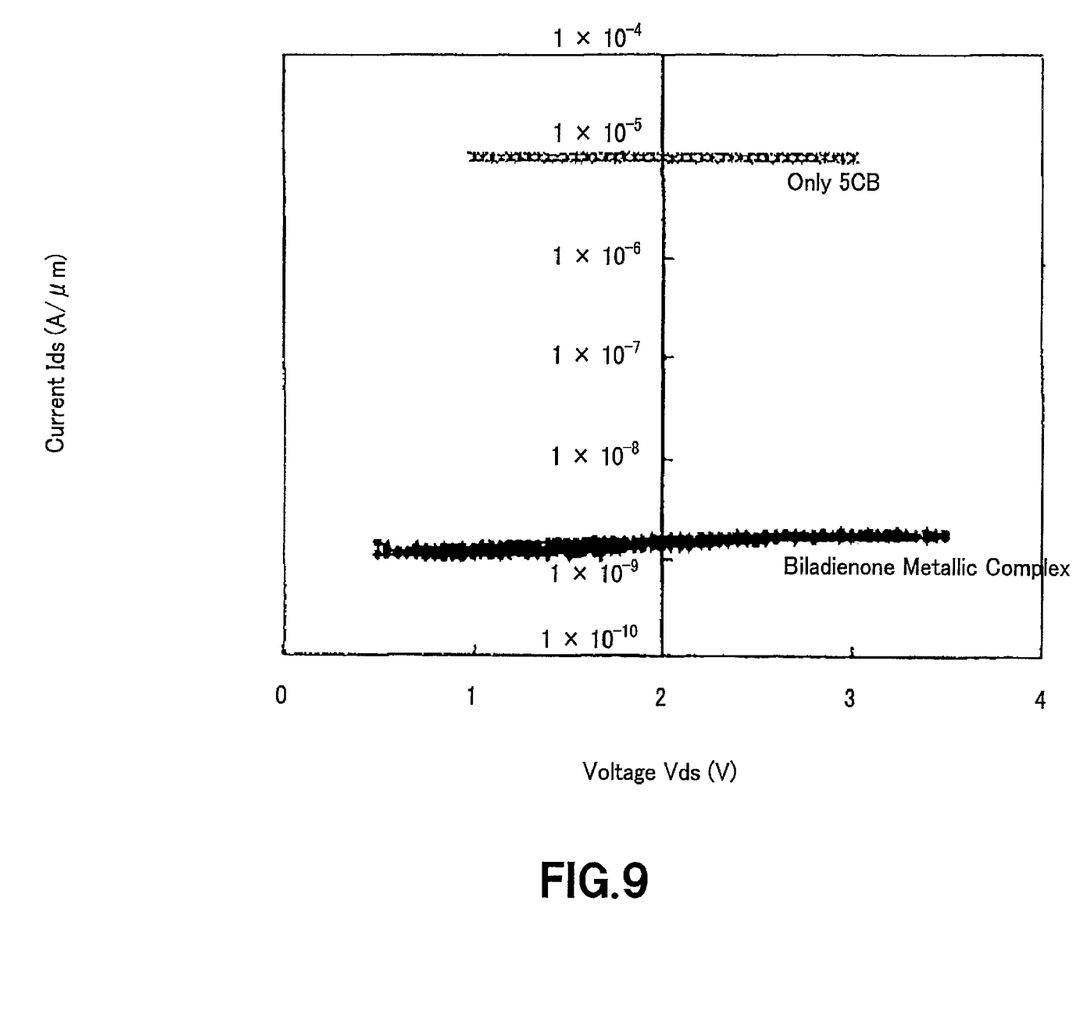
FIG. 9 is a graph showing the relationship between current and voltage of Field Effect type molecular device according to the comparative example 1 of the present invention.

As shown in FIG. 9, any change based on application of bias electric field was not found (observed). This result indicates that biladienone molecule 2 has very high orientation. This is because since the biladienone molecule (functional molecular element) indicates the transistor characteristic as shown in FIG. 7, it responds, with high sensitivity, to electric field applied across the control electric field applying electrodes 31 and 36, i.e., even very low voltage of 40 µV, but does not respond to electric field across the comb-shaped electrodes 33 and 34 by any means. In addition, this result verifies the principle as shown in FIG. 1 in which structure change takes place with respect to direction of applied electric field.

It is a matter of course that the above-described embodiments 1, 2 of the invention do not limit the present invention by any means, but may be changed or modified as occasion demands within the scope which does not depart from the gist of the present invention.

It is to be noted that while the present invention has been described in accordance with certain preferred embodiments thereof illustrated in the accompanying drawings and described in detail, it should be understood by those ordinarily skilled in the art that the invention is not limited to embodiments, but various modifications, alternative construction or equivalents can be implemented without departing from the scope and spirit of the present invention as set forth by appended claims.

INDUSTRIAL APPLICABILITY

The functional molecular element according to the present invention is used in elements or devices such as Field Effect type molecular device, etc.

It should be understood that various changes and modifications to the presently preferred embodiments described herein will be apparent to those skilled in the art. Such changes and modifications can be made without departing from the spirit and scope of the present invention and without diminishing its intended advantages. It is therefore intended that such changes and modifications be covered by the appended claims.

The invention claimed is:

1. A functional molecular element comprising a system in which an anisotropy of a dielectric constant is changed by a molecular structure change induced by an electric field, wherein the functional molecular element includes a complex of an organic molecule having anisotropy of dielectric constant or dipole moment and including side chains each of which structure is changed under application of electric field, and metallic ion.

2. The functional molecular element according to claim 1, wherein the side chain has a linear chain shape, and is substantially bonded to the disc-shaped organic molecule.

3. The functional molecular element according to claim 2, wherein a liquid crystal solution of organic metallic complex molecule that includes the organic molecule having the side chains is disposed between at least opposite electrodes in a state where orientation of the organic metallic complex molecule is performed on an electrode for applying electric field, and an output corresponding to the electric field is taken out from at least one electrode of the opposite electrodes.

4. The functional molecular element according to claim 3, wherein a columnar arrangement structure in which the organic metallic complex molecules are arranged in a column form is formed between the pair of opposite electrodes.

5. The functional molecular element according to claim 3, wherein the structure of the organic metallic complex molecule is changed by a change of the electric field exerted on the organic metallic complex molecule so that an angle that a major axis direction of a dielectric constant tensor and a formation plane surface of a pair of opposite electrodes form is changed.

6. The functional molecular element according to claim 4, wherein an insulating layer is provided on a first electrode for applying the electric field, a second electrode and a third electrode are formed, as the opposite electrodes, on the insulating layer so as not in contact with each other, the columnar arrangement structure is disposed between at least the second and third electrodes, and a fourth electrode for applying the electric field is provided on the columnar arrangement structure directly or through an insulating layer.

* * * * *